United States Patent [19]
Smith

[11] Patent Number: 5,815,096
[45] Date of Patent: *Sep. 29, 1998

[54] METHOD FOR COMPRESSING SEQUENTIAL DATA INTO COMPRESSION SYMBOLS USING DOUBLE-INDIRECT INDEXING INTO A DICTIONARY DATA STRUCTURE

[75] Inventor: Jeffrey D. Smith, Houston, Tex.

[73] Assignee: BMC Software, Inc., Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 527,687

[22] Filed: Sep. 13, 1995

[51] Int. Cl.$^6$ ....................................................... H03M 7/40
[52] U.S. Cl. ................................................................ 341/51
[58] Field of Search .................................. 382/240, 244; 341/51, 67, 79, 106

[56] References Cited

U.S. PATENT DOCUMENTS

| | | | |
|---|---|---|---|
| 5,051,745 | 9/1991 | Katz | 341/106 |
| 5,254,990 | 10/1993 | Yoshida et al. | 341/51 |
| 5,412,384 | 5/1995 | Chang et al. | 341/51 |
| 5,426,779 | 6/1995 | Chambers, IV | 341/106 |
| 5,442,350 | 8/1995 | Iyer et al. | 341/51 |
| 5,561,421 | 10/1996 | Smith et al. | 341/51 |
| 5,635,931 | 6/1997 | Franaszek et al. | 341/51 |

*Primary Examiner*—Brian K. Young
*Attorney, Agent, or Firm*—Arnold, White & Durkee

[57] ABSTRACT

A data compression method compresses a sequence of characters into a sequence of compression symbols by double-indirect indexing into a dictionary data structure arranged in a novel format, wherein the input characters as used as indirect indexes. The dictionary data structure comprises a set of state vectors, arranged in a tree-like structure, and a set of alpha arrays, arranged in a matrix-like structure. During the compression sequence, each character in the sequence is used as an index into a current alpha array, which is used to determine whether the character can be compressed. If compressible, the current alpha array provides an index to a corresponding state vector, which contains information concerning the next alpha array and the next state vector. The next alpha array becomes the next current alpha array, and the next state vector becomes the current state vector. The process is repeated until the sequence of input characters is exhausted or a non-compressible character is encountered. At that time, the compression symbol contained in the current state vector is output as the compression symbol associated with the sequence of input characters.

10 Claims, 10 Drawing Sheets

CODE SYMBOLS

| SEQUENCE | A | B | BA | BAD | C |
|---|---|---|---|---|---|
| CODE SYMBOL | 1 | 2 | 5 | 9 | 3 |

| SEQUENCE | CA | CAB | CAT | CH | CHE |
|---|---|---|---|---|---|
| CODE SYMBOL | 6 | 10 | 11 | 7 | 12 |

| SEQUENCE | CHEF | D | DE | DEE | DEER |
|---|---|---|---|---|---|
| CODE SYMBOL | 14 | 4 | 8 | 13 | 15 |

FIG. 3b

ALPHA ARRAYS

|  | 000 | 001 | 002 | ... | ... | ... | 254 | 255 |
|---|---|---|---|---|---|---|---|---|
| ALPHA 000 | | | | | | | | |
| ALPHA 001 | | | | | | | | |
| ALPHA 002 | | | | | | | | |
| ALPHA ... | | | | | | | | |
| ALPHA ... | | | | | | | | |
| ALPHA 095 | | | | | | | | |
| ALPHA 096 | | | | | | | | |
| ALPHA 097 | | | | | | | | |

FIG. 4a

STATE VECTORS

| STATE 0000 | NEXT STATE | NEXT ALPHA | NEXT STATE | NEXT ALPHA | | |
|---|---|---|---|---|---|---|
| STATE 0001 | NEXT STATE | NEXT ALPHA | | | | |
| STATE 0002 | | | | | | |
| STATE XXXX | NEXT STATE | NEXT ALPHA | NEXT STATE | NEXT ALPHA | | |
| STATE YYYY | NEXT STATE | NEXT ALPHA | | | | |
| STATE 2045 | | | | | | |
| STATE 2046 | NEXT STATE | NEXT ALPHA | NEXT STATE | NEXT ALPHA | NEXT STATE | NEXT ALPHA |
| STATE 2047 | | | | | | |

FIG. 4b

STATE VECTORS

| STATE | NODE/ CODE SYMBOL | NEXT STATE | NEXT ALPHA | NEXT STATE | NEXT ALPHA | NEXT STATE | NEXT ALPHA | NEXT STATE | NEXT ALPHA | ALPHA ARRAY |
|---|---|---|---|---|---|---|---|---|---|---|
| 00 | ROOT | A:25 | 90 | B:45 | 20 | C:105 | 40 | D:245 | 60 | 10 |
| 25 | A=1 | | | | | | | | | 90 |
| 45 | B=2 | A:65 | 30 | | | | | | | 20 |
| 65 | BA=5 | D:85 | 90 | | | | | | | 30 |
| 85 | BAD=9 | | | | | | | | | 90 |
| 105 | C=3 | A:125 | 50 | H:185 | 60 | | | | | 40 |
| 125 | CA=6 | B:145 | 90 | T:165 | 90 | | | | | 50 |
| 145 | CAB=10 | | | | | | | | | 90 |
| 165 | CAT=11 | | | | | | | | | 90 |
| 185 | CH=7 | E:205 | 70 | | | | | | | 60 |
| 205 | CHE=12 | F:225 | 90 | | | | | | | 70 |
| 225 | CHEF=14 | | | | | | | | | 90 |
| 245 | D=4 | E:265 | 60 | | | | | | | 60 |
| 265 | DE=8 | E:285 | 80 | | | | | | | 60 |
| 285 | DEE=13 | R:305 | 90 | | | | | | | 80 |
| 305 | DEER=15 | | | | | | | | | 90 |

FIG. 5b

SAMPLE SEQUENCE

| C | A | T |
|---|---|---|
| 1 | 2 | 3 |

| | ACTIONS | STATE | ALPHA | INPUT COUNTER | CHARACTER INPUT | CODE SYMBOL |
|---|---|---|---|---|---|---|
| 700 | ASSIGN ROOT STATE | ROOT | | | | |
| 705 | ASSIGN START ALPHA | ROOT | 10 | | | |
| 710 | SET INPUT COUNTER | ROOT | 10 | 1 | | |
| 715 | GET NEXT INPUT VALUE | ROOT | 10 | 1 | C | |
| 720 | GET NEXT ALPHA ENTRY | ROOT | 40 | 1 | C | |
| 725 | GET NEXT STATE ENTRY | 105 | 40 | 1 | C | |
| 730 | ADVANCE INPUT COUNTER | 105 | 40 | 2 | C | |
| 735 | GET NEXT INPUT VALUE | 105 | 40 | 2 | A | 3 |
| 740 | GET NEXT ALPHA ENTRY | 105 | 50 | 2 | A | 3 |
| 745 | GET NEXT STATE ENTRY | 125 | 50 | 2 | A | 3 |
| 750 | ADVANCE INPUT COUTNER | 125 | 50 | 3 | A | 3 |
| 755 | GET NEXT INPUT VALUE | 125 | 50 | 3 | T | 6 |
| 760 | GET NEXT ALPHA ENTRY | 125 | 90 | 3 | T | 6 |
| 765 | GET NEXT STATE ENTRY | 165 | 90 | 3 | T | 6 |
| 770 | ADVANCE INPUT COUNTER | 165 | 90 | 4 | | 11 |
| 775 | GET SYMBOL FROM FINAL STATE | 165 | 90 | 4 | | 11 |

FIG. 7

METHOD FOR COMPRESSING SEQUENTIAL DATA INTO COMPRESSION SYMBOLS USING DOUBLE-INDIRECT INDEXING INTO A DICTIONARY DATA STRUCTURE

TABLE OF CONTENTS
1. FIELD OF THE INVENTION
2. BACKGROUND OF THE INVENTION
3. SUMMARY OF THE INVENTION
4. BRIEF DESCRIPTION OF DRAWINGS
5. DETAILED DESCRIPTION OF A SPECIFIC EMBODIMENT
6. ADVANTAGES OF THE INVENTION
7. CLAIMS
8. ABSTRACT

1. FIELD OF THE INVENTION

The invention relates generally to data compression. Specifically, it relates to a method for compressing data and a program storage device for a computer or other machine that encodes instructions for performing the method.

2. BACKGROUND OF THE INVENTION

In general, data compression reduces the amount of data by converting data from one format to another. One common type of data compression involves converting text or character data into compression symbols. A compression symbol is a sequence of bits that uniquely represents another sequence of input bits. If the total number of compression symbol bits (including any padding) is less than the number of input bits, then the input stream is "positively" compressed. Otherwise, the input stream is "negatively" compressed (also called incompressible). The compression symbols may be either fixed-length or variable-length bit sequences. Variable-length symbols generally provide a higher compression rate at a higher cost of processing time than do fixed-length symbols. The data compression method discussed herein produces a stream of compression symbols that is padded to an 8-bit (1 byte) boundary. The input stream is typically a sequence of 8-bit (1 byte) character data. In general, the input character stream and the output compression symbols will begin on a byte boundary.

Two common methods of data compression are algorithmic substitution and dictionary recognition. Algorithmic substitution, such as repeating character and run-length encoding, scans the input stream and emits pre-defined compression symbols for the particular character sequences that the algorithm recognizes. The compression symbols are generally universal for all input streams. Algorithmic substitution usually requires processing the entire compressed stream to regenerate the original input stream because the encoding decisions made by the algorithm are integrated into the compressed stream at unpredictable locations.

Dictionary recognition schemes use a dictionary that associates a sequence of bits or bytes with a compression symbol. When the compression process recognizes a sequence in the input stream, the corresponding compression symbol is emitted. The compression symbols are specific to the composition of the dictionary. Dictionary recognition is theoretically capable of regenerating a portion of the original input stream because the dictionary is entirely accessible in a location separate from the compressed stream. The compression process described herein uses the dictionary recognition method with a dictionary that is pre-conditioned to the input stream: that is, the dictionary contains byte sequences (data strings) that occur frequently in the particular input stream. In a current embodiment, the strings are associated with fixed-length compression symbols. The process is easily modified to support variable-length compression symbols.

In the prior art, International Business Machines Corp. ("IBM") has a fixed-length compression symbol implementation called the Mainframe Hardware Compression Facility (the IBM Compression Facility). The IBM Compression Facility is provided as a microcode instruction called the Compression Service Call ("CMPSC" or the Microcode Facility) and as an MVS/ESA software emulation service (General Emulation). One well known IBM product that uses the IBM Compression Facility is the IBM DB2 database management subsystem, which includes support for directly issuing the CMPSC instruction and/or performing General Emulation. IBM has published the General Emulation process. However, General Emulation in software is usually about five to ten times slower than the IBM Microcode Facility. The IBM Microcode Facility advances through the dictionary by taking each input byte and scanning a possibly discontiguous list of eligible dictionary characters. After an input byte is located in the list, the process then advances its position in the dictionary to a new list of dictionary characters. When the end of the input stream is encountered or there are no more eligible dictionary characters, the current dictionary position represents the compression symbol. The process is deterministic: the same dictionary and the same input stream always produce the same compression symbol. Also, although a dictionary string could be represented by a sequence of several compression symbols (each representing a portion of the input string), the process will always match the longest possible string in the dictionary.

For improved performance, a compression symbol dictionary is generally sorted by frequency, the most frequently occurring dictionary characters are first in the list, followed by characters of decreasing frequency. As a result, however, the time required to process each input byte varies and is greatly dependent on the probability frequency of the dictionary characters. To illustrate, assuming best case, which is perfect distribution of the input characters, the time cost to compress an input string is $O(n \lg n)$, where $O(1)$ is the time cost to process one input byte, n is the number of input characters, and lgn is the binary logarithm of n. Thus, the best case scenario is non-linear.

It is advantageous to have a compression process that is linear. Linear processing means the time cost (as measured by the number of machine instructions) required to determine the compression symbol from a given input string is directly proportional to the length of the input string, or $O(n)$, such that the frequency of dictionary characters is irrelevant. Thus, the processing time to determine the compression symbol for an input string is completely dependent on the time cost to process one byte of the input stream, or the time cost of $O(1)$.

The IBM Microcode Facility is not linear, it scans the current list of dictionary characters for a match with the current input character. The list could be discontiguous in storage. When a match is found, the relative position of the character indicates the next position in the dictionary for the next input character. When the input stream is exhausted or the current input character does not occur in the dictionary's character list (in which case the input character is said to be "invalid"), the current dictionary position is emitted as the compression symbol. Thus, the IBM Microcode Facility suffers from a variable time cost to process the current input character.

In the prior art, there are data compression methods that use single-level look-up tables to perform linear data compression. Such methods require large look-up tables or matrices to handle input character streams that contain many different characters. Typically, a data compression process would encounter 256 possible input characters. The size of a look-up table for performing single-level linear compression depends on the number of compression symbols and the number of different input characters. For example, the IBM Microcode Facility has five sizes of dictionaries which produce 512, 1024, 2048, 4096, and 8192 possible compression symbols, respectively. To support linear compression, a single-level linear compression method using the equivalent of the IBM mid-size dictionary (2048 symbols) would require a look-up matrix of 524,288 (2048× 256) entries. In addition, each entry must contain information about advancement to the next position (state), which typically requires 4 bytes of storage. Thus, a look-up table of 2,097,152 bytes (2 megabytes) would be required to represent a fully populated mid-size dictionary.

In light of the above disadvantages in prior art data compression techniques, there is a need for a compression process that executes in linear time while also reducing the amount of data storage needed for its attendant look-up table of data compression symbols.

3. SUMMARY OF THE INVENTION

A method in accordance with the invention achieves superior speed in compressing a sequence of characters into a sequence of compression symbols by double-indirect indexing into a dictionary data structure arranged in a novel format, using the input characters as indirect indexes into the dictionary data structure.

It has been observed that most of the entries in a single-level look-up matrix are invalid (zero) entries because a linear compression process greatly reduces the number of available dictionary characters as it advances along (i.e., as it compresses) the input stream. In other words, for each character in the input stream that is processed the number of valid remaining dictionary entries (eligible dictionary characters) decreases rapidly to zero. Therefore, a tremendous amount of space can be saved by representing each state (embodied as a row in the look-up matrix) as a variable length vector with as many entries as there are valid dictionary characters for that particular state.

In accordance with the invention an input character is translated by means of an auxiliary matrix, called an ALPHA array. Specifically, an input character is used as an index into the ALPHA array. Each state, or state vector, has an associated ALPHA array. If two or more states have the same list of eligible dictionary characters (without regard to frequency sort), then those states share the same ALPHA array. The translation yields an offset into the current state vector which is used to identify the next state and the next ALPHA array for that state. If the ALPHA array translation yields an invalid result, the process completes by emitting the compression symbol associated with the current state. Typically, each state requires 12 bytes and each ALPHA array requires 512 bytes. The state vector contains the compression symbol and any other information as needed. For variable-length compression symbols, the symbol size in bits is included.

Use of a two-level indirect look-up scheme consisting of ALPHA arrays and state vectors can greatly reduce the size of the compression symbol look-up table. For example, a mid-size (2048 entry) dictionary implemented as a two-level indirect look-up table has a total space cost of between about 71,000 bytes and 190,000 bytes. This represents a space savings of 91% to 96% as compared to a mid-size dictionary such as the IBM Hardware dictionary which uses a standard single-level look-up table implementation.

A dictionary data structure in accordance with the invention is composed of a set of ALPHA arrays associated with a set of state vectors. The ALPHA arrays are organized in a matrix-like data structure; one of the ALPHA arrays is designated as the starting ALPHA array. The state vectors are organized into a tree-like structure, with one state vector being designated as the root-level state vector. Each state vector includes a unique compression symbol that represents the unique sequence of characters encountered in traversing the state-vector tree to reach that particular state vector. Each state vector is associated with exactly one ALPHA array; any given ALPHA array can be associated with multiple state vectors (i.e., different state vectors which have the same set of valid dictionary characters can share an ALPHA array).

In compressing a sequence of characters, an input character is used as an index into the starting ALPHA array. The indexed entry in the starting ALPHA array indicates whether the input character is a valid dictionary character. If so, then the indexed entry is itself used as an index into the root-level state vector. The indexed entry in the root-level state vector contains an indication (e.g., a pointer or an offset) identifying the next state vector in the tree and the next associated ALPHA array. This process is repeated until the sequence of input characters is exhausted or an invalid character is detected in the then-current ALPHA array, at which time the compression symbol contained in the current state vector is emitted.

4. BRIEF DESCRIPTION OF DRAWINGS

FIGS. 3a and 3b illustrate a Ziv-Lempel compression symbol tree and a table listing the associated compression symbols.

FIGS. 4a and 4b are sets of ALPHA arrays and state vectors in accordance with the inventive compression method.

FIGS. 5a and 5b are examples of ALPHA arrays and state vectors in accordance with the Ziv-Lempel compression symbol tree of FIG. 3a.

FIG. 7 is an example of a compression process in accordance with the invention.

5. DETAILED DESCRIPTION OF A SPECIFIC EMBODIMENT

Figure 1:
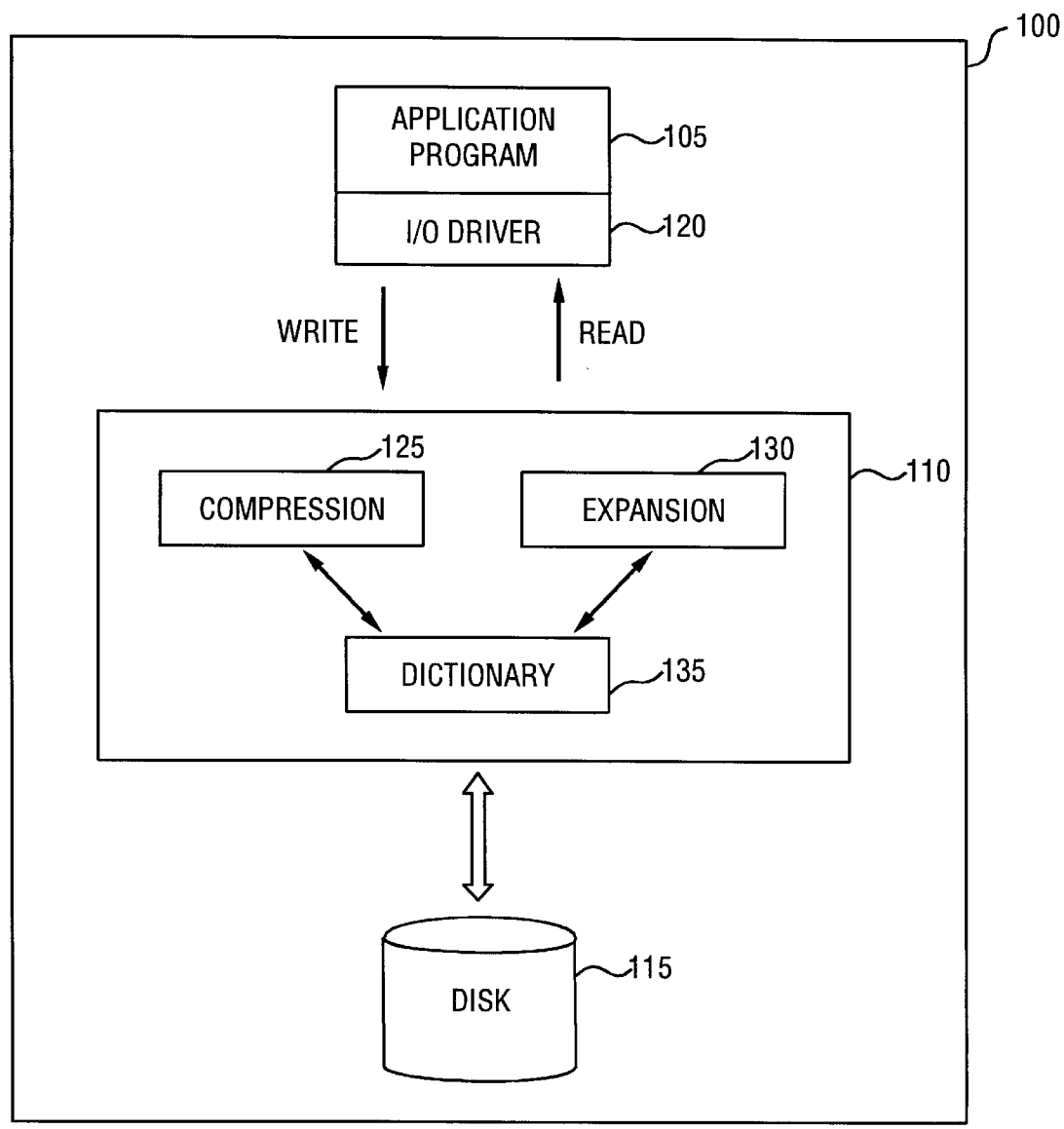
FIG. 1 is an overview of a computing environment using compression.

FIG. 1 illustrates a computing environment 100, in which an application program 105 uses a data compression interface 110 to maximize the amount of data that can be stored on a data storage device 115, such as a direct access storage disk. The data compression interface 110 is configured such that it interacts with the application program 105 during every data-read and data-write request. In general, data is in uncompressed format, such as character data, when it is being used by the application program 105, and data is compressed when it is stored in (or on) the disk 115. By using the data compression interface 110, data from the application program 105 is compressed when it is stored on the disk 115, and expanded or decompressed when it is retrieved from disk 115.

To illustrate, when the application program 105 wants to write character data to disk 115, it issues a data-write request via its input/output (I/O) driver 120. The request is intercepted by the interface 110, which will compress the data using the compression program 125. Once compressed, the data is then output to disk 115 for storage. When the application program 105 needs data from disk 115, it issues a read request via the I/O driver 120. The read request is intercepted by the interface 110, which will first retrieve the compressed data from disk 115 and expand or decompress the data using the expansion program 130. Once decompressed, the restored data is sent to the application program for processing.

Figure 2:
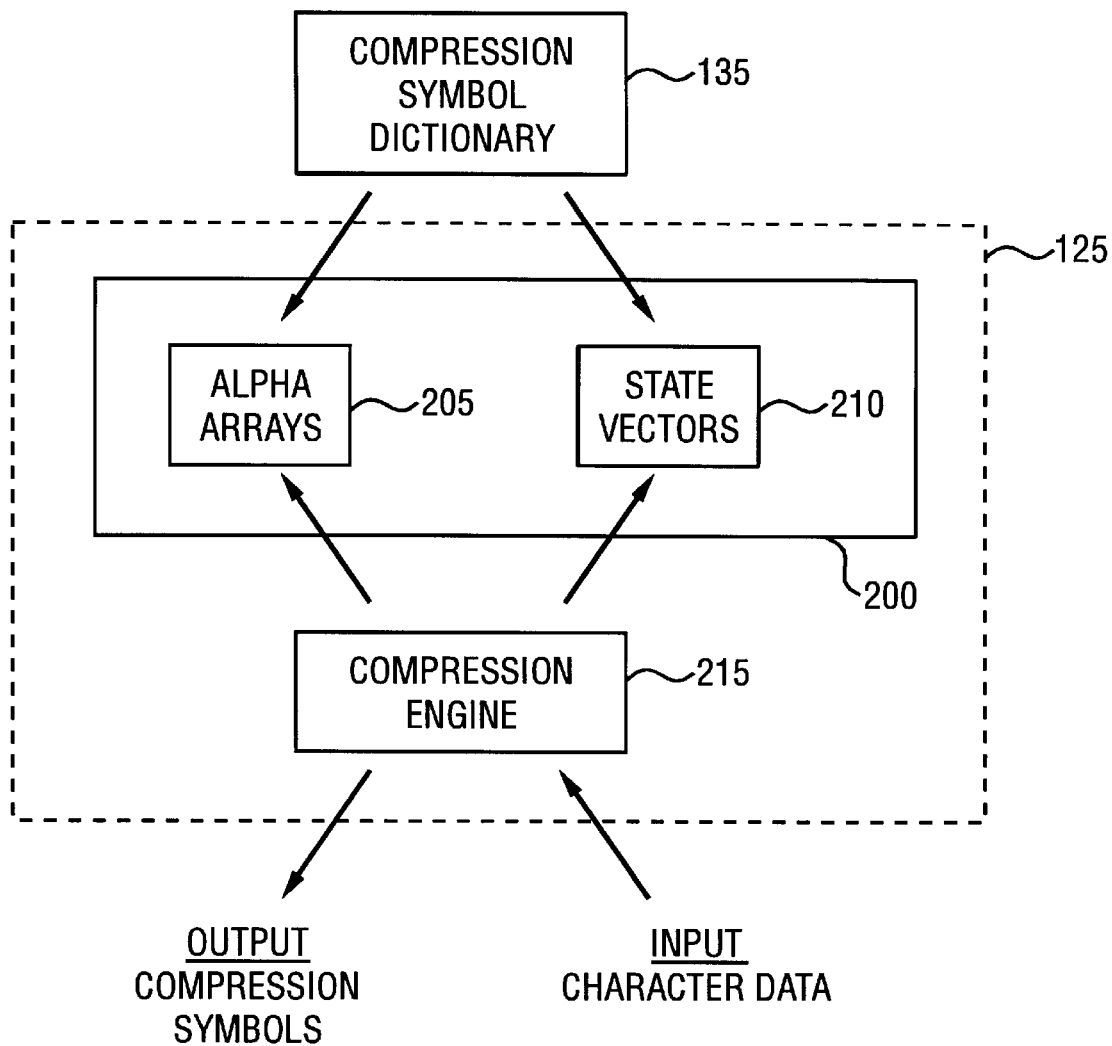
FIG. 2 is a block diagram of the key components of the invention.

FIG. 2 shows the key components of the present invention. The compression program 125 implemented according to one embodiment of the present invention comprises an internal dictionary structure 200, composed of a set of ALPHA arrays 205 and a set of state vectors 210, and a software-based compression engine 215, which converts input character data into compression symbols of the type that are associated with the compression symbol dictionary 135. The dictionary 135 contains compression symbols arranged in a Ziv-Lempel (ZL) tree format. As such, a dictionary as used in the present invention is a machine-code representation of a ZL tree of compression symbols. Each node on the ZL tree has a compression symbol associated with it. The ALPHA arrays 205 and the state vectors 210 are built based on the compression symbol dictionary 135. Specifically, there is a state vector corresponding to each compression symbol in the dictionary 135, and there is an ALPHA array associated with each state vector. While each state vector can have only one associated ALPHA array, one ALPHA array can be associated with multiple state vectors. In other words, one ALPHA array can be shared by multiple state vectors. State vectors 210 are variable in length and contain information concerning the next valid characters in the current input character string. ALPHA arrays 205 are used to determine whether the next character in a character string is valid. If valid, the ALPHA array will be used to locate the state vector and ALPHA array associated with the next valid character. The compression engine 215 translates or encodes the input character data into compression symbols by using the input character as indexes into the ALPHA arrays and associated state vectors. Once all the valid characters in an input character string are exhausted, the compression symbol associated with the last state vector is selected to represent the character string.

Figure 3A:
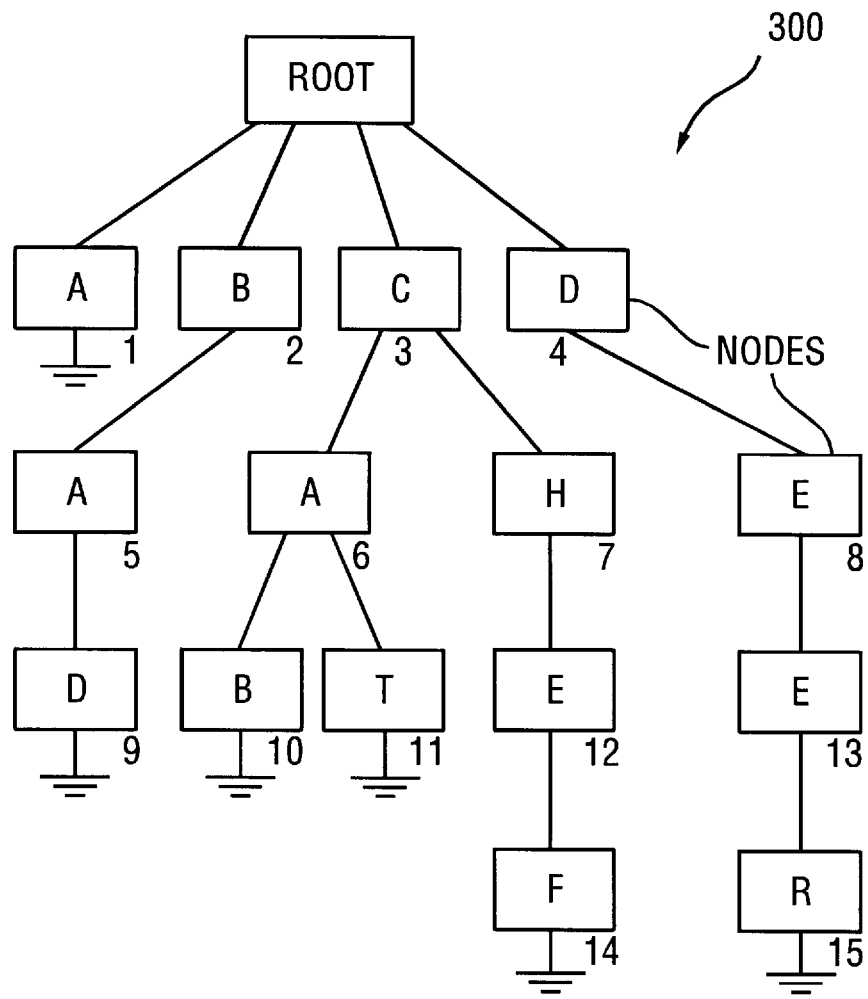

FIG. 3a is an example of a small ZL tree 300 that can be associated with a dictionary. The tree has a root level and many branch levels; there are nodes at each branch level. Each node has one parent node and zero or more child nodes. In addition, each node has a character and a compression symbol associated with it. For example, the node associated with the character "C" has a parent node, which is the root, and two child nodes, which are the nodes having the characters "A" and "H." The child nodes represent all the valid characters after the parent node. That is, after the character "C," only the characters "A" or "H" are valid in this particular ZL tree.

FIG. 3b is a table listing all the character combinations that are valid in the ZL tree 300 of FIG. 3a. As shown in FIG. 3b, 15 different character strings, ranging from one to four characters in length, are associated with the ZL tree 300. The compression symbol that represents each character string is the compression symbol associated with the last valid character in the ZL tree. For example, the character string "CAT" has a compression symbol of "11," which corresponds to the compression symbol associated with the node "T," see FIG. 3a and FIG. 3b. On the other hand, for a character string of "CAR," only the characters "CA" are valid and the last letter "R" is invalid. Therefore, only the character string of "CA" can be compressed and represented by the compression symbol of "6." Typically, the compression symbols are assigned according to the frequency of occurrence such that the most frequently occurring data strings are associated with compression symbols.

During compression, the compression program 125 compares the input character string to pre-defined character strings in the dictionary 135. If there is a match, then the compression symbol associated with the string is selected to represent the character data. An input character string may be represented by one or more compression symbols. During expansion, the expansion program 130 uses the dictionary 135 to convert the compression symbols to their associated character strings.

FIG. 4a is an example of a set of ALPHA arrays according to one embodiment of the invention. Each ALPHA array comprises 256 entries where each entry corresponds to one of the possible set of input characters. Two well-known examples of such character sets are the ASCII and EBCDIC character sets. In ASCII and EBCDIC, each character in the character set has a numerical value between 0 and 255. These values define a complete set of characters. In another embodiment of the invention, each ALPHA array can have as many or as few bytes as necessary to represent each of the different types of input data. Each entry in the ALPHA array comprises either: (1) a invalid-character indication, which may be indicated by the numerical value of zero, or (2) an index into a state vector associated with the ALPHA array.

FIG. 4b is an illustrative set of state vectors according to one embodiment of the invention. Each state vector is variable in length and comprises a compression symbol and zero or more pairs of: (1) a next-state-vector indicator and (2) a next-ALPHA-array indicator. Each state vector represents a node on a ZL compression symbol tree, and each pair of the next-state-vector indicator and next-ALPHA-array indicator represents a valid next character associated with the node.

Figure 5A:
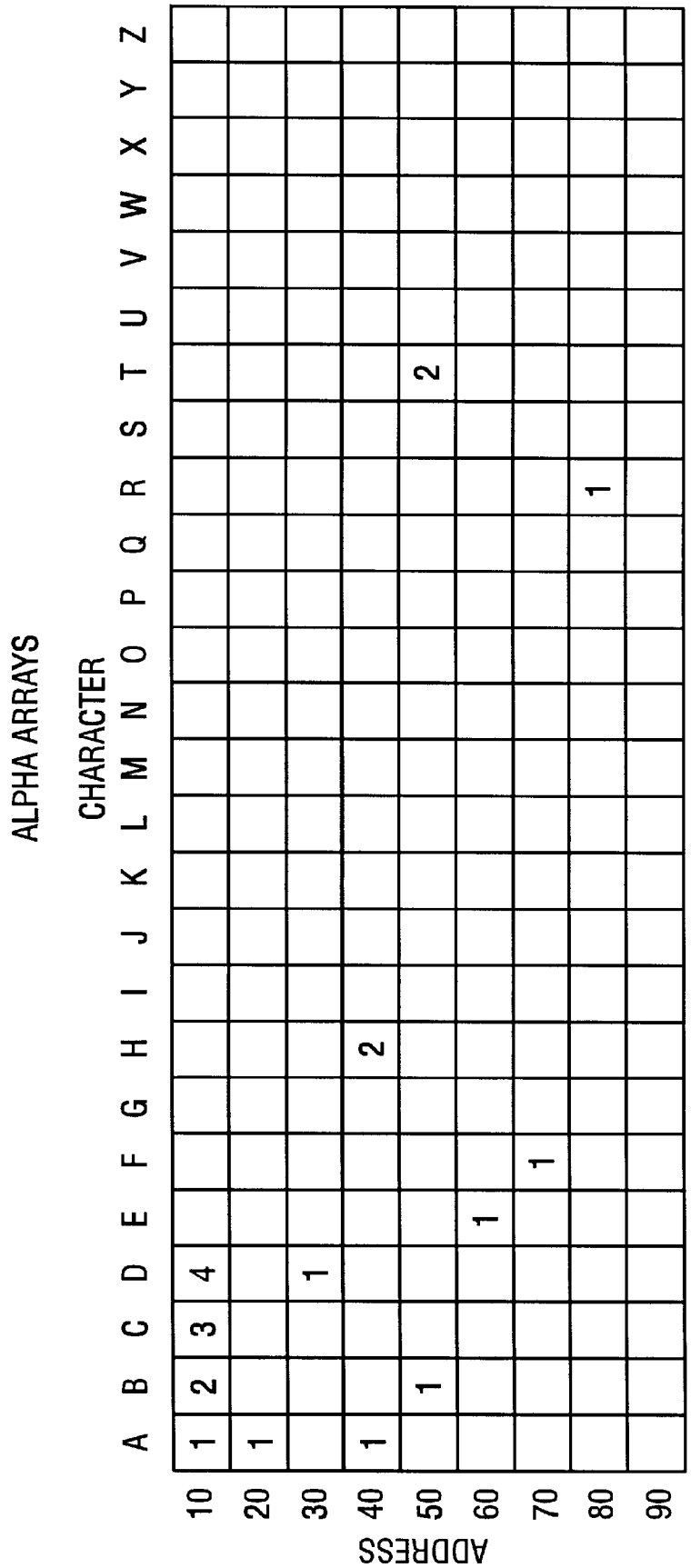

Figure 5a is an illustrative set of ALPHA arrays corresponding to the ZL tree 300 shown in FIG. 3a. Each ALPHA array has an address and 26 entries corresponding to the letters A to Z. Each entry has either: (1) a numeric value, which represents an index into the state vector associated with the ALPHA array, or (2) a blank which means the character associated with that entry is an invalid next character. For example, in the first ALPHA array (address 10), the entries corresponding to the letters A, B, C, and D have numerical values. Thus, these letters represent valid next characters and their associated numerical values (1, 2, 3, and 4 respectively) are indexes into the state vector associated with the ALPHA array (at address 10). As for the remaining characters E through Z, their entries are blank; therefore, they are not valid next characters.

FIG. 5b is an example of a set of state vectors corresponding to the ZL tree of compression symbols as shown in FIG. 3a. As previously described, there is a state vector associated with each node in the ZL tree 300. Each state vector has an address (i.e., a state identifier) and contains the compression symbol associated with the node. Each state vector is variable in length and contains zero or more pairs of: (1) a next-state-vector address and (2) a next-ALPHA-array address (hereinafter, "next-state addresses"). Each state vector has a corresponding ALPHA array, where each ALPHA array contains information concerning which characters are valid next characters and indexes to the next-state addresses associated with the next valid characters.

For example, the state vector at address 00 represents the root node of the ZL tree 300. At the root there are four valid next characters, "A," "B," "C," and "D." Each of these characters are represented by a pair of next-state addresses. The ALPHA array associated with state vector 00 is the ALPHA array with address 10. As shown in FIG. 5a, the ALPHA array at address 10 has the valid next characters "A," "B," "C," and "D" and their corresponding next-state addresses are found in state vector 00 in the order of 1, 2, 3, and 4.

Figure 6A:
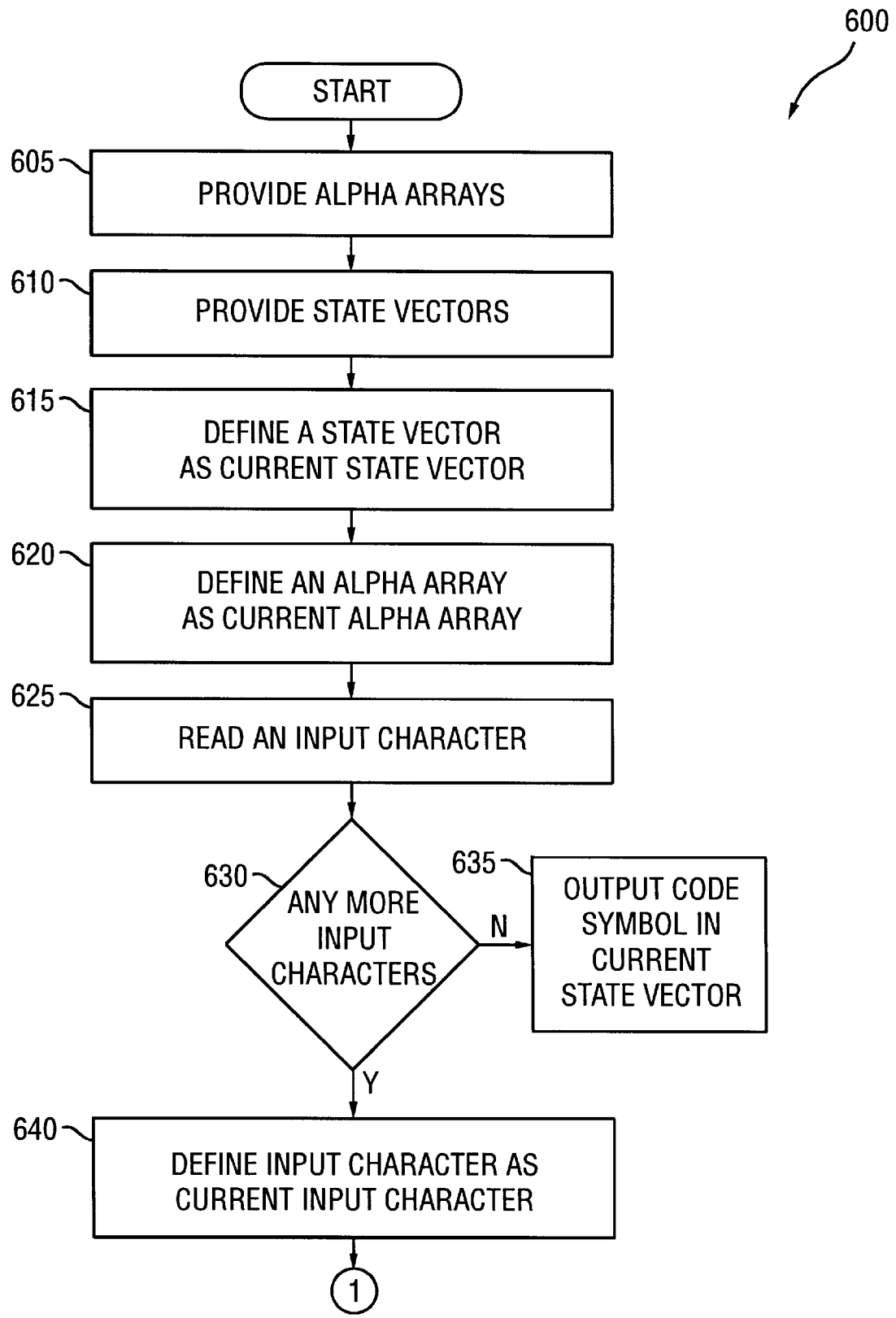
FIGS. 6a and 6b is a flow chart of a compression method in accordance with the invention.
Figure 6B:
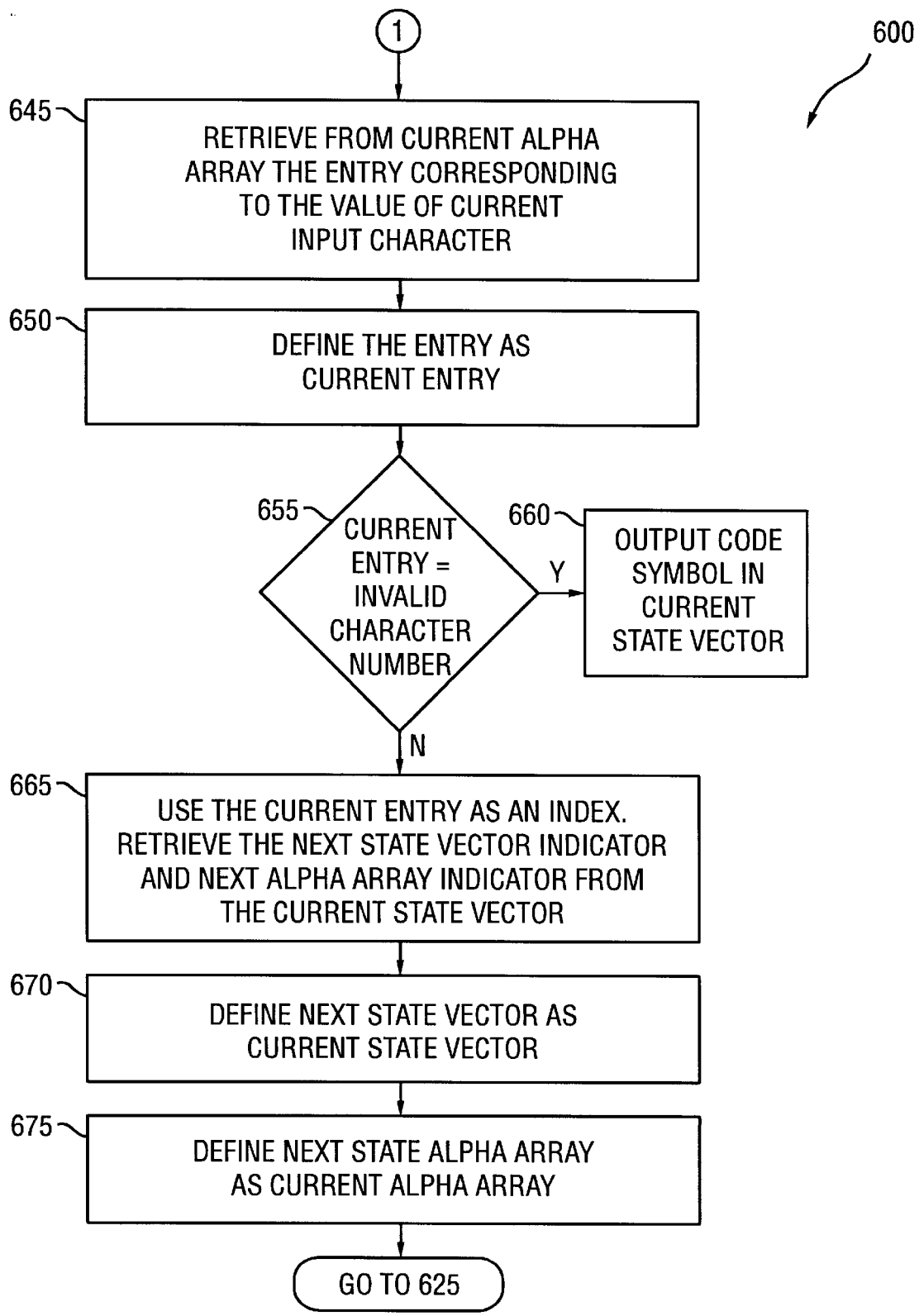

Referring to FIGS. 6a and 6b, a flow chart 600 of a specific implementation of a machine-executed method in accordance with the inventive two-level indirect look-up scheme for compressing a sequence of characters into a compression symbol is shown. Those persons of ordinary skill having the benefit of this disclosure will recognize that the sequence of characters can be part of a larger sequence. That is, the entirety of a sequence of characters need not be compressed to achieve the benefits of the invention.

Steps 605 and 610.

A set of ALPHA arrays and a set of state vectors are dynamically built in memory based on the content of a compression symbol dictionary that is selected for compressing the input character sequence. The dictionary is selected based on the frequency of occurrence and the pattern of the character data in the input character sequence. The ALPHA arrays are in the format as shown in FIG. 4a, and the state vectors are in format as shown in FIG. 4b.

Steps 615 and 620.

The root state vector is defined as the current state vector and the root ALPHA array is defined as the current ALPHA array entry.

Step 625.

A single character is read from the input character sequence.

Step 630.

Determine whether there are any more input character data. If no more data exists, then the compression symbol in the current state vector is output 635 as the compression symbol representing the input character sequence. Else, continue to Step 640.

Step 640.

The just read character is defined as the current input character. (Continue process flow as shown in FIG. 6b.)

Steps 645 and 650.

The current input character is used as a position index into the current ALPHA array to retrieve the entry corresponding to the current input character. In other words, the numerical value of the input character is used to locate an entry in the current ALPHA array and to retrieve the contents stored in that entry. That entry is defined as the current translation entry.

Steps 655 and 660.

If the current translation entry is an invalid-character indicator (i.e., does not appear in the in the dictionary at the current position), then output the compression symbol contained in the current state vector as the compression symbol corresponding to the input character sequence. Else, continue to Step 665.

Step 665:

The current state vector is retrieved from the position indicated by the current translation entry; this position is referred to as an indexed position. The next-state-vector indicator and the next-ALPHA-array indicator located at the indexed position are retrieved.

Steps 670 and 675:

The state vector identified by the next-state-vector indicator is defined as the current state vector and the ALPHA array identified by the next-ALPHA-array indicator is defined as the current ALPHA array.

The method repeats steps 625 through 675 until either the end of the input character sequence has been reached or the current input character is invalid, thereby terminating the compression for the current sequence. In either case, the compression symbol associated with the last input character represents the compression symbol for the input character sequence up to the last input character.

An example of this compression method is shown in FIG. 7. Using the compression method disclosed in FIG. 6a and FIG. 6b, the character sequence of "CAT" is compressed into a single compression symbol of "11." A compression symbol dictionary representing the ZL tree 300 as shown in FIG. 3a is selected. The characters C, A, and T are arranged in a ZL tree format, wherein C has a compression symbol of "3," "CA" has a compression symbol of "6," and "CAT" has a compression symbol of "11."

ALPHA arrays and state vectors, as shown in FIG. 5a and FIG. 5b respectively, are constructed based on the compression symbol dictionary representing ZL tree 300 of FIG. 3a. As shown in FIG. 5a and discussed above, each ALPHA array has at least 26 entries, corresponding to the letters A through Z, wherein A has a numerical value of 1 and Z has a numerical value of 26. Each entry contains either an invalid-character indicator, which is represented as a blank, or an index value that references the next "state vector/ALPHA array" pair in a state vector.

As shown in FIG. 5b and discussed above, each state vector has a compression symbol and zero or more pairs of a next-state-vector indicator, which points to the address of the next state vector and a next-ALPHA-array indicator, which points to the address of the next ALPHA array.

The steps to compress the input sequence of "CAT" are shown in FIG. 7. In Step 700, the root state vector is assigned as the current state vector. In Step 705, the first ALPHA array (i.e., the alpha array having address 10, see FIG. 5a) is assigned as the current ALPHA array. In Step 710, the input character counter is set to 1. In Step 715, the first character in the sequence, "C," is read and set as the current input character. In Steps 720 and 725, using "C" as an index, the next state vector and ALPHA array pair is determined. Specifically, the numerical value of "C," which is 3, points or indexes to the current ALPHA array to select the third entry in the current ALPHA array. The value in the third entry, which is 3, is used as a second index into the current state vector. The value 3 corresponds to the third pair of next "state vector/ALPHA array" pair in the current state vector. Therefore, the next ALPHA array address is 40 and the next state vector is 105, see FIG. 5b.

In Step 730, the input character counter is set to 2. In step 735, the next character "A" is read and set as the current input character. In Steps 740 and 745, using "A" as an index, the next state vector and ALPHA array pair is determined. Character "A" (with a numerical value of 1) points to the first entry in the ALPHA array at address 40, which contains an entry of "1." The value "1" points or indexes to the first pair in state vector 105, which shows that the next ALPHA array address is 50; the next state vector is 125. See FIG. 5b.

In Steps 750 and 755, the input character count is set to 3 and the next character "T" is read. In Steps 760 and 765, the next state vector and ALPHA array pair is determined. Character "T" (with a numerical value of 20) indexes to the twentieth entry (address 50, see FIG. 5a) in the ALPHA array, which contains an entry of "2." The value "2" points or indexes to the second pair in state vector 125 (see FIG. 5b), which shows that the next ALPHA array address is 90 and the next state vector is 165.

In Step 770, the input character count is set to 4, which exceeds the number of input characters; therefore, no more input characters are read. As a result, in Step 775, the compression symbol associated with the current state vector 165 is selected and represents the compression symbol for the data sequence of CAT. That is, the method generates a compression symbol "11."

A compression method in accordance with the invention is preferably implemented in IBM system 370 assembly language for execution in the MVS operating environment. An illustrative embodiment (in system 370 assembly language) for traversing a compression symbol dictionary 135 in accordance with the inventive method is given in Table 1. One of ordinary skill will recognize that the first 7 lines in Table 1 are directed to the instance when the input stream comprises a single character or is an invalid character (that is, does not appear in the compression symbol dictionary at the current position).

TABLE 1

| UNIT | IC | 2,INPUT(3) | Insert character into R2 from INPUT at location R3. |
|------|------|------------|---------------------------------------|
|      | BXH  | 3,5,EXIT   | End of input stream? |
|      | LA   | 1,0(2,2)   | Double the character for half word index. |
|      | AH   | 1,ALPHA_SLOT(1) | Get transition information? |
|      | BM   | EXIT       | MINUS: No more transitions. |
|      | A    | 10,SV_ALPHA(1) | Transition to next shared ALPHA array. |
|      | A    | 11,SV_STATE(1) | Transition to next unique state vector. |
| LOOP | IC   | 2,INPUT(3) | Insert next character. |
|      | LA   | 1,0(2,2)   | Double the character. |
|      | AH   | 1,ALPHA_SLOT(1) | Get transition information? |
|      | BM   | END        | MINUS: No more transitions. |
|      | A    | 10,SV_ALPHA(1) | Transition to next shared ALPHA array. |
|      | A    | 11,SV_STATE(1) | Transition to next unique state vector. |
|      | BXLE | 3,5,LOOP   | End of input stream? |
| END  | LH   | 2,SV_SYMBOL | Compression symbol for current state. |
| EXIT | STH  | 2,OUTPUT   | Store compression symbol. |

6. ADVANTAGES OF THE INVENTION

A compression method in accordance with the invention provides linear compression time of an input character/data stream. That is, the time required to compress a given sequence of characters is directly proportional to the number of characters in the sequence. Thus, the time required to compress data grows linearly with the number of characters. In contrast, many prior art techniques exhibit a growth in compression time that is considerably faster.

A related advantage is that the time required to compress a given sequence of characters is not as dependent on the quality of the dictionary (e.g., whether the dictionary entries are sorted in a statistically appropriate order).

It will be appreciated by those of ordinary skill having the benefit of this disclosure that numerous variations from the foregoing illustration will be possible without departing from the inventive concept described herein. Accordingly, it is the claims set forth below, and not merely the foregoing illustration, which are intended to define the exclusive rights claimed in this application program.

What is claimed is:

1. A machine-executed method for compressing a sequence of characters into a compression symbol, each character in said sequence of characters having a numerical character value between 0 and 255, said compression symbols being selected from a machine-readable dictionary of compression symbols organized in a Ziv-Lempel tree format, said method comprising:

(a) providing (1) a set of fixed-length array representations in a memory referred to as ALPHA arrays, and (2) a set of variable-length array representations in a memory referred to as state vectors;

each said ALPHA array having 256 entries, one for each character in said set of characters, and comprising either (1) an invalid-character indication or (2) an index into a state vector associated with said ALPHA array, and each said state vector comprising (1) a compression symbol and (2) zero or more pairs of transition indicators, wherein each pair of transition indicators comprises (i) a next-state-vector indicator and (ii) a next-ALPHA-array indicator;

(b) defining one of said state vectors as a current state vector and defining one of said ALPHA arrays as a current ALPHA array;

(c) reading a character from said sequence of characters and defining said character as a current input character;

(d) retrieving from said current ALPHA array the entry corresponding to said current input character's character value, said retrieved entry value referred to as a translation entry;

(e) if said translation entry is an invalid-character indicator, then outputting the compression symbol contained in the current state vector, else (1) retrieving, from said current state vector at a position indicated by said translation entry, the next-state-vector indicator and the next-ALPHA-array indicator;

(2) defining the state vector identified by said next-state-vector indicator as the current state vector and defining the ALPHA array identified by said next-ALPHA-array indicator as the current ALPHA array; and (3) if said sequence of characters contains a next character, then defining said next character as said current input character and repeating the actions described in paragraphs (d) through (e), else outputting the compression symbol contained in the current state vector.

2. A machine-executed method for compressing a sequence of characters into a compression symbol, each character in said sequence of characters belonging to a set of characters each of which is represented by a number that is referred to as a character value, said method comprising:

(a) providing (1) a set of array representations in a storage device, referred to as ALPHA arrays, and (2) a set of variable-length state array representations in a storage device; referred to as state vectors, each said ALPHA array having one entry for each character in said set of characters, where each said ALPHA array entry comprises either (1) a invalid-character indication or (2) an index into a state vector associated with said ALPHA array, and each said state vector having (1) a compression symbol and (2) zero or more pairs of transition indicators, where each pair of transition indicators comprises (i) a next-state-vector indicator and (ii) a next-ALPHA-array indicator;

(b) defining one of said state vectors as a current state vector and defining one of said ALPHA arrays as a current ALPHA array;

(c) reading a character from said sequence of characters and defining said character as a current input character;

(d) retrieving from said current ALPHA array the entry corresponding to said current input character's character value, said retrieved entry value referred to as a translation entry;

(e) if said translation entry is an invalid-character indicator, then outputting the compression symbol contained in the current state vector, else (1) retrieving, from said current state vector at a position indicated by said translation entry, the next-state-vector indicator and the next-ALPHA-array indicator;

(2) defining the state vector identified by said next-state-vector indicator as the current state vector and defining the ALPHA array identified by said next-ALPHA-array indicator as the current ALPHA array; and (3) if said sequence of characters contains a next character, then defining said next character as said current input character and repeating the actions described in paragraphs (d) through (e), else outputting the compression symbol contained in the current state vector.

3. The method of claim 2, wherein said set of characters comprises 256 characters whose character values are 0 through 255 respectively.

4. The method of claim 2, wherein said storage device comprises random-access memory.

5. The method of claim 2, wherein said compression symbols have a fixed bit length.

6. The method of claim 2, wherein each said ALPHA array comprises 256 entries.

7. The method of claim 2, wherein said sequence of characters comprises a portion of a larger sequence of characters.

8. A machine having a memory containing a data structure comprising:

(a) a set of array representations, referred to as ALPHA arrays, each said ALPHA array having a plurality of entries, each said entry comprising either (1) a invalid-character indication or (2) an index into a state vector associated with said ALPHA array; and (b) a set of variable-length state array representations, referred to as state vectors, each said state vector having (1) a compression symbol and (2) zero or more pairs of transition indicators, each pair of transition indicators comprise (i) a next-state-vector indicator and (ii) a next-ALPHA-array indicator.

9. The machine of claim 8, wherein each of said ALPHA array comprises 256 entries.

10. A machine-readable program storage device in which are encoded instructions for performing the method of a specified one of claims 1 through 7.

* * * * *